United States Patent [19]

Proudfoot

[11] Patent Number: 4,794,298
[45] Date of Patent: Dec. 27, 1988

[54] ION SOURCE

[75] Inventor: Gary Proudfoot, Wantage, England

[73] Assignee: United Kingdom Atomic Energy Authority, London, England

[21] Appl. No.: 904,269

[22] Filed: Sep. 8, 1986

[30] Foreign Application Priority Data

Sep. 17, 1985 [GB] United Kingdom ............... 8522976

[51] Int. Cl.⁴ ............................................ H01J 39/34
[52] U.S. Cl. ................................... 313/363.1; 313/230; 313/359.1; 313/349; 250/396 R; 250/492.3; 315/111.31; 315/111.81
[58] Field of Search ............. 313/363.1, 360.1, 231.31, 313/246, 296, 297, 411, 361.1; 315/111.81, 111.41, 111.91, 111.31; 250/492.3, 298, 423 R, 396 R

[56] References Cited

U.S. PATENT DOCUMENTS

| 2,794,118 | 5/1957 | Kiriloff et al. | 315/111.81 |
| 2,946,915 | 7/1960 | Haase | 313/296 |
| 3,908,123 | 9/1975 | Veach et al. | 250/298 |
| 4,104,875 | 8/1978 | Birner et al. | 313/360.1 |
| 4,358,686 | 11/1982 | Kinoshita | 204/192.32 |
| 4,447,773 | 5/1984 | Aston | 313/360.1 |
| 4,481,062 | 11/1984 | Kaufman et al. | 313/360.1 |
| 4,574,179 | 3/1986 | Masuzawa et al. | 315/111.81 |
| 4,578,589 | 3/1986 | Aitken | 250/492.2 |
| 4,611,121 | 9/1986 | Miyamura et al. | 315/111.81 |

Primary Examiner—Leo H. Boudreau
Assistant Examiner—Mark R. Powell
Attorney, Agent, or Firm—William R. Hinds

[57] ABSTRACT

An ion beam source adapted to provide a plurality of parallel planar ion beams the centers of which are superimposed and the planes of which are inclined at an angle to the line joining their centers such that a geometric projection of the ion beams in a direction orthogonal to that joining the centers of the ion beams is continuous.

5 Claims, 1 Drawing Sheet

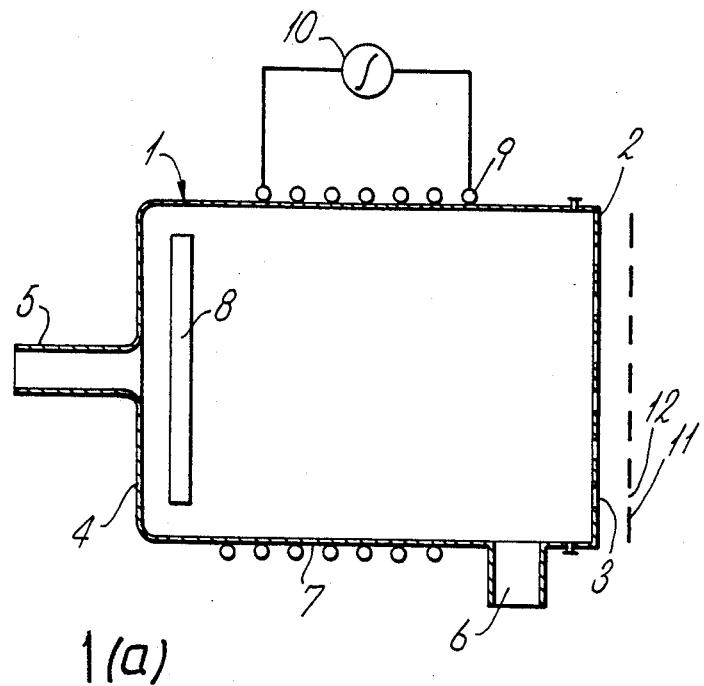
1(a)
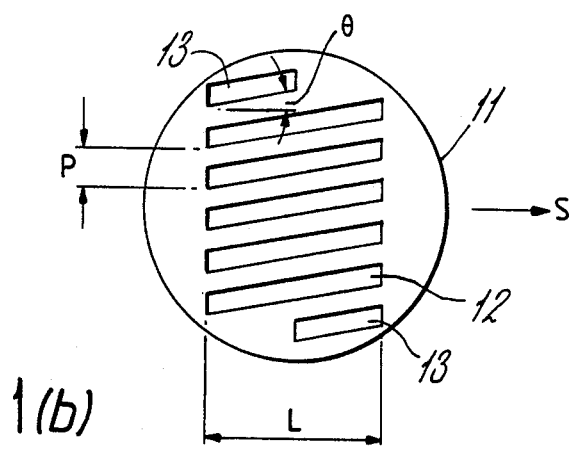
1(b)

ION SOURCE

The present invention relates to ion sources, and more particularly to high current ion beam sources for the ion implantation of silicon wafers to produce electronic devices.

High current ion beams, that is to say 100 mA or more, are required for the implantation of silicon wafers on a commercial scale. Such ion beams have to be mass analysed magnetically and also provide a large area of uniform deposition of ions. Usually this information is sought to be obtained by the electrical or mechanical scanning of the ion beam over the required area in two orthogonal directions. However, at high beam currents, difficulties can arise when electrostatic scanning is used, which can lead to a loss of control over the direction of the ion beam.

Our co-pending U.K. Patent Application No. 8 518 922 describes an arrangement in which an ion source which produces a plurality of parallel elongated beamlets with their larger axes aligned with the anaylsing magnetic field, or fields, but even this arrangement requires some electrical or mechanical manipulation of the ion beams to achieve the desired uniformity.

It is an object of the present invention to provide a system whereby the need for electrical or mechanical scanning of the ion beam is avoided.

According to the present invention there is provided an ion beam source adapted to provide an array of parallel planar ion beams the centres of which are colinear and the planes of which are inclined at an angle to the line joining their centres such that a geometric projection of the ion beams in a direction orthogonal to that of the line joining the centres of the ion beams is continuous at least.

The planar ion beams can be produced by means of an extractor electrode having a plurality of superimposed parallel slits formed in it with their contents colinear and their longitudinal axes at an angle to the line joining their centre, such that geometric projections of the slits in a direction orthogonal to that of the line joining the centres of the slits overlap to give the effect of one continuous slit.

Preferably, at each end of the plurality of slits there is a shorter slit.

The invention will now be explained, by way of example, with reference to the accompanying drawing, which shows diagrammatically in FIGS. 1(a) and 1(b) two views of an ion source embodying the invention.

Referring to FIG. 1(a), an ion source embodying the invention consists of a chamber 1, one end wall 2 of which has a plurality of superiposed parallel slits 3 in it. The opposite end wall 4 has a port 5 by means of which the chamber 1 can be evacuated. A port 6 is formed in the side wall 7 of the chamber 1 and enables a volatile gas, the ions of which are to be provided by the source, to be bled into the chamber 1. Near the end wall 4 is a quartz plate 8 which serves both as a baffle and to protect the end wall 4 of the chamber 1. A coil 9 surrounds the chamber 1 and is connected to a power source 10 by means of which the material inside the chamber 1 can be excited to a plasma state. The end wall 2 is electrically isolated from the remainder of the chamber 1 and acts as an extraction electrode. A second extraction electrode 11 also is shown. The extraction electrode 11 has slits 12 which are coincident with those in the end wall 2 of the chamber 1.

FIG. 1(b) shows the arrangement of the slits in the extraction electrode 11 and the end wall 2 of the chamber 1. The slits 12 have a length L, a pitch P and are inclined at an angle $\theta$ to the direction orthogonal to the centre line of the slits 12. Shorter slits 13 are included at the top and bottom of the array of slits.

The angle $\theta$ required to give uniform coverage of a target which is passed through the ion beam in the direction S can be derived as follows. Each individual beamlet will have a Gaussian distribution perpendicular to its major transverse axis of the form $\exp -x^2/\alpha^2$, where $\alpha$ is the distance from the ion source to the target multiplied by the tangent of the angle of divergence of the beamlet perpendicular to its major transverse axis. It can be shown that, excepting for the top and bottom beamlets, the departure from uniformity is less than 0.5 $(1-\mathrm{erf}\, P/\alpha)$ from which P may be derived, provided that the divergence of the beamlets parallel to their major transverse axes is small, as is the case when large aspect ratios are used. The "end effects" associated with the top and bottom beamlets are compensated for by the additional shorter slits 13. One then arrives at a value for the angle of inclination of the slits 12 given by the expression $\theta = \sin^{-1}(P/L)$.

I claim:

1. An ion beam source comprising a chamber, means for introducing into the chamber a gaseous medium ions of which are to be provided by the source, means for establishing a plasma within the chamber, and means for extracting ions from the plasma and providing an array of parallel planar ion beams the centres of which are colinear and the planes of which are at an oblique angle to the line joining their centres such that a geometric projection of the ion beams in a direction orthogonal to that of the line joining the centres of the ion beams and orthogonal to the direction of beam propagation is continuous at least.

2. An ion beam source adapted to provide an array of parallel planar ion beams the centres of which are colinear and the planes of which are at an oblique angle to the line joining their centres such that a geometric projection of the ion beams in a direction orthogonal to that of the line joining the centres of the ion beams and orthogonal to the direction of beam propagation is continuous at least, said ion beam source comprising a chamber, means through which the chamber can be evacuated, means for introducing into the chamber a gaseous medium ions of which are to be provided by the source, means for establishing a plasma within the chamber, and an extraction electrode by means of which the said ions can be extracted from the plasma, wherein the extraction electrode includes a lamina having an array of parallel slits formed in it with their centres colinear and their major axes at an angle $\theta$ to the direction orthogonal to the line joining their centres given by the relation $\theta = \sin^{-1} P/L$ where P is the distance between the centres of successive slits and L is their length.

3. An ion source according to claim 2 wherein the extraction electrode is constituted by an end wall of the chamber and there is included at least one other extraction electrode having therein a system of slits similar to those in the said end wall of the chamber and aligned therewith.

4. An ion source according to claim 2 wherein there is included at each end of the array of slits a compensating slit shorter than the other slits but parallel thereto the two compensating slits also being disposed oppositely relative to the line joining the centres of the other slits.

5. An ion source according to claim 3 wherein there is included at each end of the array of slits a compensating slit shorter than the other slits but parallel thereto, the two compensating slits also being disposed on opposite sides of the line joining the centres of the other slits.

* * * * *